United States Patent [19]

Cranford, Jr. et al.

[11] 4,404,577
[45] Sep. 13, 1983

[54] ELECTRICALLY ALTERABLE READ ONLY MEMORY CELL

[75] Inventors: Hayden C. Cranford, Jr., Apex; Charles R. Hoffman, Raleigh; Geoffrey B. Stephens, Cary, all of N.C.

[73] Assignee: International Business Machines Corp., Armonk, N.Y.

[21] Appl. No.: 164,470

[22] Filed: Jun. 30, 1980

[51] Int. Cl.$^3$ .................... H01L 29/78; H01L 27/02
[52] U.S. Cl. ........................................ 357/23; 357/41; 307/238.3
[58] Field of Search ................ 307/23 VT, 238.3; 357/23, 41

[56] References Cited

U.S. PATENT DOCUMENTS

| 4,099,196 | 7/1978 | Simko | 357/41 |
| 4,119,995 | 10/1978 | Simko | 357/41 |
| 4,274,012 | 6/1981 | Simko | 357/41 |
| 4,300,212 | 11/1981 | Simko | 357/23 X |

Primary Examiner—James W. Davie
Assistant Examiner—J. Carroll
Attorney, Agent, or Firm—Edward H. Duffield

[57] ABSTRACT

A reduction in cell area and an improvement in tolerance allowed for programming and erase voltages is achieved utilizing a diffused control gate having improved capacitive coupling to the floating gate through a thin oxide grown on single crystal silicon.

3 Claims, 7 Drawing Figures

|  | CELL A | | | | CELL B | | | | CELL C | | | | CELL D | | | |
|---|---|---|---|---|---|---|---|---|---|---|---|---|---|---|---|---|
|  | $C_1$ | $P_1$ | $E_1$ | $D_1$ | $C_1$ | $P_2$ | $E_2$ | $D_1$ | $C_2$ | $P_1$ | $E_1$ | $D_2$ | $C_2$ | $P_2$ | $E_2$ | $D_2$ |
| WRITE A | 16 | 0 | 0 | * | 16 | 16 | 0 | * | 0 | 0 | 0 | * | 0 | 16 | 0 | * |
| ERASE A | 0 | 16 | 16 | * | 0 | 16 | 0 | * | 16 | 16 | 16 | * | 16 | 16 | 0 | * |
| READ A | 5 | 5 | 0 | 5 | 5 | 0 | 0 | 5 | 5 | 5 | 0 | 0 | 5 | 0 | 0 | 0 |

*DRAINS ARE OPEN DURING WRITE/ERASE

|  | CELLS A-D | | | | | |
|---|---|---|---|---|---|---|
|  | C | E | $X_1$ | $X_2$ | $D_1$ | $D_2$ |
| WRITE A | 25 | 25 | 5 | 0 | 16 | 0 |
| READ A | 5 | 5 | 5 | 0 | 5 | 0 |

|  | CELL A | | | | | |
|---|---|---|---|---|---|---|
|  | C | E | $X_1$ | $X_2$ | $D_1$ | $D_2$ |
| ERASE ABCD | 0 | 25 | 0 | 0 | 0 | 0 |

ELECTRICALLY ALTERABLE READ ONLY MEMORY CELL

FIELD OF THE INVENTION

This invention relates generally to MOS floating gate field effect transistor devices and memory cells and in particular to those forms of the device which are electrically programmable and electrically erasable via a tunneling mechanism of electrons through the oxide insulators.

PRIOR ART

Numerous metal oxide semiconductor (MOS) cells have been developed employing floating gates for storing charge for controlling the state of conduction of an active device. The state of charge on a floating gate can be used to represent a binary state of the conductive mechanism of the active device controlled thereby.

While devices of this type are numerous, those typically having electrically programmable and electrically erasable read only operation are exemplified by U.S. Pat. No. 4,099,196. As described in this reference, it is known that the conduction mechanism through an oxide layer grown on polycrystalline silicon is dependent upon electric field direction. The rough top surface of the polycrystalline silicon (polysilicon) layer causes local field enhancement which can cause injection of electrons at a reduced electric field when this layer is biased negatively with respect to upper conductive layer on the opposite side of the polycrystalline oxide insulator. If the polarity of the electric field is reversed, a much higher field is necessary for the injection of charge. In addition, it is generally known that oxides grown from polysilicon conduct charge more readily, i.e., at 1/5 to 1/7 of the field required for conduction through oxides grown from single crystal silicon.

In devices of the sort described, in order to achieve a high electric field between a floating gate and the programming or erase gates, respectively, it is necessary to have a large capacitive coupling from the floating gate to the control gate so that the potential on the floating gate may be held relatively constant while programming or erase gates are raised or lowered to other potentials. As shown in the aforementioned patent, this requirement usually results in the provision of relatively large cell area since the capacitive coupling is through the same oxide layer to which both the programming and erase gates are capacitively coupled to the floating gate. The general expense and complexity of utilizing more and more substrate area is undesirable. A potential solution to this would be to thin the oxide layers selectively in the area of the control gate to increase capacitive coupling. However, this will require a separate mask and process step which complicates the repeatability of the process and tracking of the development of capacitance ratios and, moreover, it increases the electric field across the control gate capacitance which will compete for the injection of charge onto the floating gate.

In addition, the floating gate itself has a parasitic capacitance between itself and the substrate wherever it overlies thinner oxide such as over the channel of the active device and this must be overcome by coupling to the control gate. Also, since the thin oxide layers so grown are grown independently in a separate step from the polysilicon to polysilicon oxidation step and since the thin oxide areas are independently defined by different masks, a large variation in coupling capacitance tolerances will be experienced in practice.

All of the foregoing problems and proposed solutions essentially involve more complicated processing by the use of additional masks and the resultant loss of tracking in the formation of the capacitances and their ratios or interject additional process steps which are more desirably avoided.

OBJECTS OF THE INVENTION

In light of the foregoing difficulties with the known prior art, it is an object of the present invention to provide an improved electrically programmable and electrically erasable read only memory MOS device having a floating gate for controlling the state of an active device and a control gate having higher capacitance and better capacitive ratio tracking in a reduced cell area for denser device construction.

SUMMARY

The present invention meets the foregoing and yet other unenumerated objects by providing a control gate diffusion in the surface of the semiconductive substrate and which is further provided with a thin oxide grown on the single crystal silicon substrate to isolate the diffused control gate from the floating gate. Since the thin oxide region is grown from the single crystal silicon and is grown at the same time as the gate oxide, the thickness and capacitance per unit area closely track those developed for the parasitic substrate to floating gate capacitance. Also, the areas of the two capacitances vary in the same proportions since they are both defined by the dimensions of the floating gate. A saving in cell area results from reduced overlap area required for the coupling capacitance and additional area is saved because an erase electrode or gate can be stacked on top of the control electrode in a vertical sequence isolated from the control electrode by polyoxide.

DETAILED SPECIFICATION

Figure 1:
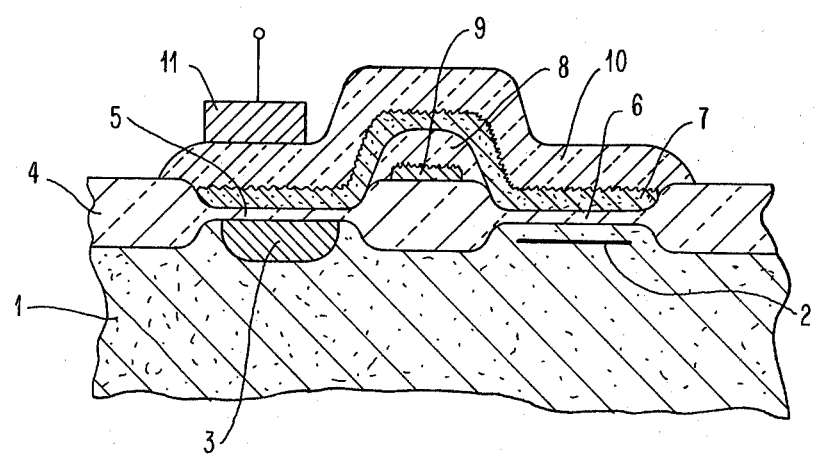
FIG. 1 illustrates a schematic cross section of a preferred embodiment of the invention.

Turning to FIG. 1, a silicon substrate 1 is illustrated in cross section cutting through the active channel 2 for the memory cell conductive element between its source and drain (not shown). This may be generally illustrated in FIG. 2 by the sectional lines showing the view direction apparent in FIG. 1. A diffused control gate area 3 is imbedded in substrate 1 at a position laterally spaced apart from the conductive channel of the active FET 2. A single crystal silicon oxide insulator layer 4 (grown from single crystal silicon) having thinner areas 5 and 6 overlying the control gate and the active FET areas, respectively, is also shown. The floating gate 7 of polysilicon overlies these regions 5 and 6 as well as a region of polyoxide (oxide grown from polysilicon) 8 separating the program polysilicon gate 9 from the floating gate. An insulating cover layer 10 of polyoxide is also shown and above it is a metal erase gate 11 in the region generally overlying the diffused control gate 3. Appropriate electrical contacts are indicated for attachment to the control gate 3, the program gate 9, the erase gate 11 and would also be indicated as shown in FIG. 2 for the source and drains.

Figure 2:
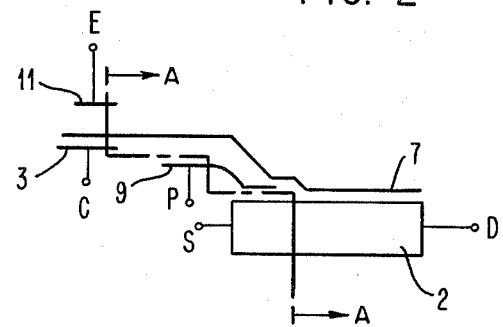
FIG. 2 illustrates an electrical schematic diagram for the overall device of the preferred form of the present invention.

Turning to FIG. 2, it may be seen that three separate capacitances between the various controlling gate regions and the floating gate are shown in an electrical schematic form. The capacitances between the various gate elements and the floating gate 7 are a function of the type and thickness of the insulating oxide layer separating them from the floating gate 7 and the surface area of the floating gate 7 and the control gates. A fourth capacitance exists between the floating gate and the surface of the active device 2.

As shown in FIG. 1, one of the keys to constructing the device according to the present invention lies in reducing the thickness of the oxide layer 5 between the control gate 3 and the floating gate 7 which increases the capacitive coupling therebetween. In general, it is desired that the capacitance of this gate to gate interface be much much greater than the capacitance between the erase gate and the floating gate or the programming gate and the floating gate. Given this consideration, it is apparent that most of a voltage drop developed by applying a voltage to the control gate 3, while the programming gate 9 is grounded, will be developed across the smaller capacitance existing between the floating gate and the programming gate. Hence, a greater field will be developed for the writing or programming of the floating gate with the appropriate field direction across the polyoxide 8 used for programming.

The said field may also appear across the erase polyoxide 10 during programming, but the direction of the field is of opposite direction so that the aforementioned local field enhancement does not cause conduction. (Thus cells B and D shown in FIG. 3 exhibit no oxide conduction during programming cell A.)

In order to selectively erase cell A, the erase gate $E_1$ is raised to the erase potential while the control gate $C_1$ is kept at ground, thus creating a high field in the appropriate direction to conduct electrons from the floating gate. Since $E_1$ is common to other cells in the same column, the control gates for the other cells must also be raised to a high potential in order to avoid erasure. If these said other control gates are taken to the erase potential, the programming gates for these said other cells must also be taken to a high potential to prevent unwanted programming of said other cells.

Figures 3, 4:
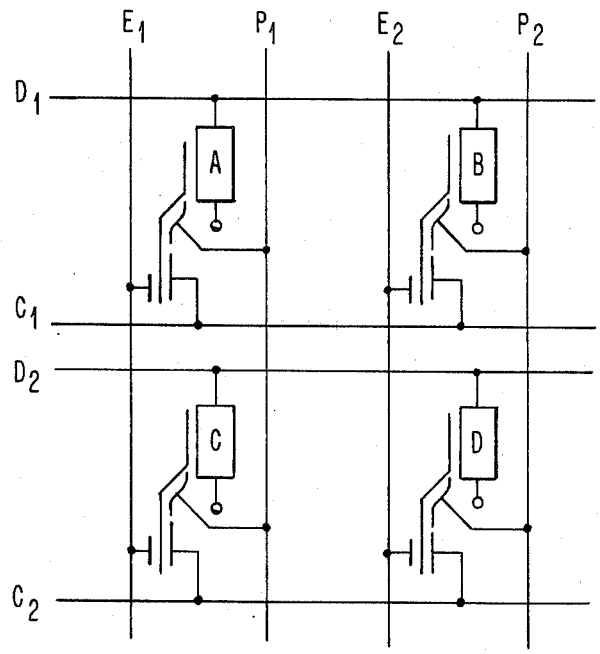
FIG. 3 illustrates an example of a two by two matrix of one and one-half device cells as configured for a read only memory using these devices.
FIG. 4 is a table showing typical read/write and erase voltages on the control gate, programming gate, erase gate, and drain portions for each of the cells A through D illustrated in FIG. 3 when only cell A is being written, read or erased.

FIG. 4 shows the voltage conditions for selective write and erase of cell A by means of oxide conduction discussed earlier. The voltages shown prevent the buildup of sufficient electric fields in the oxides of cells B, C, and D for oxide conduction for either write or erase. Thus, cell A is written and erased while cells B, C, and D are not.

Turning to FIG. 3, an electrical schematic of a four cell memory matrix employing the devices of the present invention is illustrated with appropriate control gate, erase gate, programming gate and drain voltage selection lines as shown. FIG. 4 illustrates the voltage applications for the control gate, programming gate, erase gate, and the drain lines in FIG. 3 for each of the cells A through D shown in FIG. 3 for the several operations of writing, erasing or reading cell A. Similar conditions for the remaining cells exist and can be developed from FIG. 4 simply by substituting cell B, C, D, etc., for cell A and placing cell A in the conditions listed for the one it is replaced by, etc. The contents of the table in FIG. 4 are voltages for voltage levels applied to the respective control lines shown in FIG. 3.

Returning to FIG. 1, some illustrative dimensions are as follows: the thickness of areas 5 and 6 is approximately 40 to 50 nanometers and those of the areas 8 and 10 are on the order of 160 to 240 nanometers so that relatively large (4 or 5 to 1) capacitance ratios exist based on the oxide thicknesses alone before the conductor areas are taken into account. In addition, the oxide layer 4 is single crystal silicon oxide having lower conductivity and hence, greater dielectric strength which improves the voltage handling ability still further. The roughened uppermost surface of the polysilicon program gate and polysilicon floating gate are also depicted in FIG. 1. These can be enhanced by a light predeposition or will result naturally from the effect of depositing polysilicon. The effect on enhancing the injection of electrons from this reference surface has been previously noted. As will be apparent to those of skill in the art, the areas where the control gate region 3 and the conductive channel region 2 which are overlain with thin oxide will have capacitances that track fairly well with the deposition of the polysilicon floating gate 7 since the windows in the single crystal oxide layer 4 are opened up over regions 5 and 6 simultaneously and the deposition process for the floating gate 7 occurs over them simultaneously in a latter step. Thus, mask alignment problems and process variations are mutually experienced by these various areas resulting in closer control of the capacitance ratios from chip to chip and cell to cell.

While the improved coupling has been described for a cell using oxide conduction for write and erase, it will be obvious to those skilled in the art that similar benefits will be achieved for a cell which is programmed with channel hot electron injection.

A complete sequence of operation for constructing the device as shown in FIG. 1 are as follows:

Conventional masking, doping and selective oxidation steps are followed to produce a substrate 1 of first conductivity type, which has regions 5 and 6 of thin oxide, separated by regions of thick oxide 4.

A first polysilicon layer is then deposited over the substrate and doped to achieve the desired conductivity. Regions such as 9 are then patterned using plasma etching techniques. The thin oxide regions 5, 6, not covered by said first poly regions are then etched back to bare silicon and a new oxide layer is grown in these regions. At the same time, a thicker oxide will be grown on the top surface and sides of the first poly patterns. By performing the oxidation in steam and oxygen at a relatively low temperature (approximately 800° C.) a ratio of 4 or 5 to 1 of oxide thickness on the polysilicon to oxide thickness on single crystal silicon can be achieved. The oxide grown on the top surface of the first polysilicon layer electrode 9 has a lowered field requirement for injection of electrons from the said first polysilicon layer when an appropriate electric field is applied between this electrode and an upper second electrode.

After the said oxidation step, a photo resist mask may be used to define a doped region of second conductivity type which is the ion implanted control gate 3. The implant can be done with arsenic.

A second upper polysilicon layer is deposited on the substrate and doped. This layer is then patterned using plasma etching techniques to form a floating gate region 7 which overlies the control gate 3 in the thin oxide region 5 and overlies the channel region 2 in the thin oxide region 7.

The source and drain regions of said second conductivity type are then ion implanted with arsenic ions through any exposed thin oxide regions while either first or second poly regions as well as the thick oxide regions serve as masks for the ion implant.

The structure is then subjected to an annealing cycle at 1000° C. to activate the ion implanted regions and diffuse them to their final junction depth.

A second polysilicon oxidation step is then performed to isolate the floating gate with the polyoxide region 10. This oxide layer will also have reduced electric field requirements for injection of electrons from the lower floating gate electrode to an upper electrode.

The structure is completed by forming contact windows through the various oxides over the poly 1 programming gate 9, the diffusion control gate 3, and the source and drain diffusions and by patterning metal electrodes over said windows and over the floating gate to form the erase gate 11.

While the process sequence has been described for an N channel MOS cell, it will be obvious to those skilled in the art to form a P channel MOS cell.

As an added benefit, the improved coupling ratio between the diffused control gate and the floating gate can also be used to great advantage in programming a memory cell by the use of "hot" channel electrons. Using this technique, the floating gate can be charged without the programming gate shown in the figures. Instead, programming of the cell is accomplished by simultaneously pulsing the control gate and the drain voltage. Erasure is conducted in the normal manner described above and erasure by block is possible with both types of cells. The hot electron writing or programming technique, since it requires one less element in the structure, is desirable from a manufacturing viewpoint since it simplifies the manufacturing operation and improves device yield ratios for cells constructed to use the technique.

Figures 5, 6A, 6B:
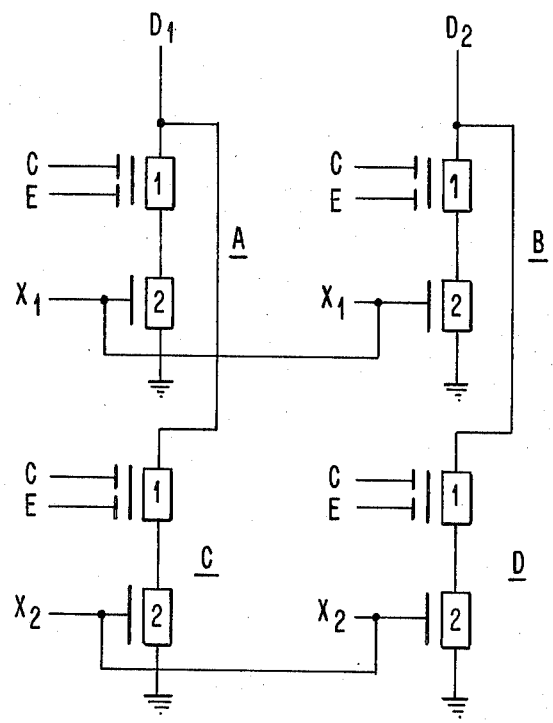
FIG. 5 illustrates a four cell memory section adapted for hot electron programming without the use of a program gate.
FIGS. 6A and 6B illustrate, respectively, the control conditions for erasing cells A-D in the configuration of FIG. 5 and, alternatively in FIG. 6B, the conditions for a reading or writing of cell A in FIG. 5.

It should be noted that the oxide conduction used for write and erase in the cells of FIGS. 3 and 4 is an extremely low power mechanism with currents in the picoampere range. The hot electron injection mechanism depicted by FIGS. 5, 6A and 6B results in the conduction of high drain to source currents in the device 1's of FIG. 5 when they are being programmed. (Currents are approximately 2 ma per cell at 16 V.) Thus, while the hot electron injection cell might be somewhat simpler to construct, it has higher power consumption than the oxide conduction cell. The mechanism of channel hot electron programming is discussed in U.S. Pat. No. 4,119,995 and is now well understood in the art. It should be noted that the increased coupling which made the diffused control gate useful for the oxide conduction write/erase cell also is of benefit in a hot electron write cell since a high voltage must be coupled to the floating gate (for this type of writing) so that a high electric field can be established on the gate oxide near the drain in the channel so that hot electron injection to the floating gate will take place.

Having thus described our invention with relation to a preferred embodiment thereof, it will be apparent to those of skill in the art how the benefits thereof can be obtained in a variety of configurations for devices of this character. Hence, the claims are by way of example only and are not to be taken as limitation for the basic invention.

Having thus described our invention with relationship to preferred embodiments thereof, what we claim and desire to protect by Letters Patent is:

1. An electrically programmable and erasable MOS memory cell structure, comprising:
   a silicon substrate having a source, a drain and a conductive channel means connecting said source and drain;
   a diffused control gate region of semiconductive material separate from said conductive channel and located in the surface of said substrate; and
   means for connecting a source of electrical potential to said source, said drain and said diffused control gate region;
   a single crystal silicon oxide insulator layer overlying said diffused control gate region, said channel region and said substrate, said oxide insulator layer being thinner in the vertical direction over said diffused region and over said channel region than over other portions of said substrate;
   an electrically floating conductive gate means deposited on the surface of said single crystal silicon oxide layer in a zone overlying at least a portion of both said diffused control gate region and said conductive channel region;
   a layer of polycrystalline oxide overlying said electrically floating conductive gate;
   a conductive erase gate means overlying said insulating layer of polycrystalline oxide in a region generally overlying said diffused control gate region in said substrate beneath, said conductive erase gate means being supplied with an electrical contact for applying an erase voltage across said polycrystalline oxide to said floating gate means by capacitive coupling through said oxide insulator layers;
   said single crystal silicon oxide and said polycrystalline silicon oxide are in the areas which overly said diffused control gate and said conductive channel, respectively of thicknesses related to one another by approximately the ratio of one to four, said single crystal oxide thickness being represented by the numerator.

2. An electrically programmable and erasable MOS memory cell structure, comprising:
   a silicon substrate having a source, a drain and a conductive channel means connecting said source and drain;
   a diffused control gate region of semiconductive material separate from said conductive channel and located in the surface of said substrate; and
   means for connecting a source of electrical potential to said source, said drain and said diffused control gate region;

a single crystal silicon oxide insulator layer overlying said diffused control gate region, said channel region and said substrate, said oxide insulator layer being thinner in the vertical direction over said diffused region and over said channel region than over other portions of said substrate;

an electrically floating conductive gate means deposited on the surface of said single crystal silicon oxide insulator layer in a zone overlying at least a portion of both said diffused control gate region and said conductive channel region;

a conductive programming gate means overlying said single crystal silicon oxide insulator and underlying said floating gate means in a region laterally between said control gate diffusion area and overlying at least a portion of said channel area in the surface of said oxide insulation;

a layer of polycrystalline silicon oxide insulating said programming gate from said floating gate and being provided with an electrical contact for connecting a source of electrical potential thereto; and a conductive erase gate means overlying said insulating layer of polycrystalline oxide in a region generally overlying said diffused control gate region in said substrate beneath, said conductive erase gate means being supplied with an electrical contact for applying an erase voltage across said polycrystalline oxide to said floating gate means by capacitive coupling through said oxide insulator layers;

said single crystal silicon oxide and said polycrystalline silicon oxide are in the areas which overly said diffused control gate and said conductive channel, respectively of thicknesses related to one another by approximately the ratio of one to four, said single crystal oxide thickness being represented by the numerator.

3. A memory cell as described in claim 1 or claim 2, wherein:

the thickness of said single crystal oxide, in the areas which overly said diffused control gate and said conductive channel, respectively is approximately in the range of 40 to 50 nanometers and the thickness of said polycrystalline oxide is approximately in the range of 160 to 240 nanometers.

* * * * *